(12) United States Patent
Mourieras

(10) Patent No.: US 12,256,513 B2
(45) Date of Patent: Mar. 18, 2025

(54) REFERENCE ELECTRICAL POTENTIAL ASSEMBLY AND ATTACHMENT ASSEMBLY FOR PRINTED CIRCUIT

(71) Applicant: LATELEC, Labege (FR)

(72) Inventor: Julien Mourieras, Toulouse (FR)

(73) Assignee: LATELEC, Labege (FR)

( * ) Notice: Subject to any disclaimer, the term of this patent is extended or adjusted under 35 U.S.C. 154(b) by 515 days.

(21) Appl. No.: 17/616,947

(22) PCT Filed: Jun. 8, 2020

(86) PCT No.: PCT/EP2020/025267
§ 371 (c)(1),
(2) Date: Dec. 6, 2021

(87) PCT Pub. No.: WO2020/249257
PCT Pub. Date: Dec. 17, 2020

(65) Prior Publication Data
US 2022/0167521 A1 May 26, 2022

(30) Foreign Application Priority Data
Jun. 11, 2019 (FR) .................................... 1906196

(51) Int. Cl.
*H01R 4/30* (2006.01)
*H01R 12/59* (2011.01)
*H05K 1/14* (2006.01)
*H05K 7/14* (2006.01)
*H01R 4/06* (2006.01)
*H05K 9/00* (2006.01)

(52) U.S. Cl.
CPC ........... *H05K 7/1407* (2013.01); *H01R 4/308* (2013.01); *H01R 12/59* (2013.01); *H05K 1/147* (2013.01); *H01R 4/06* (2013.01); *H05K 9/0039* (2013.01)

(58) Field of Classification Search
None
See application file for complete search history.

(56) References Cited

U.S. PATENT DOCUMENTS

| | | | |
|---|---|---|---|
| 4,458,296 A | 7/1984 | Bryant | |
| 4,547,835 A * | 10/1985 | Pansaerts | H05K 7/1407 361/801 |
| 4,927,367 A * | 5/1990 | Salvagno | H05K 9/0039 439/97 |
| 5,381,314 A | 1/1995 | Rudy | |
| 5,785,449 A * | 7/1998 | DiBene | H05K 7/1407 411/105 |
| 7,983,053 B2 * | 7/2011 | Joist | H05K 7/1407 333/260 |
| 8,116,087 B2 * | 2/2012 | Lo | H05K 7/142 361/740 |
| 2010/0243312 A1 | 9/2010 | Slocum | |
| 2010/0259907 A1 | 10/2010 | Lo | |

FOREIGN PATENT DOCUMENTS

CN 102781151 12/2014

\* cited by examiner

*Primary Examiner* — Felix O Figueroa
(74) *Attorney, Agent, or Firm* — Defillo & Associates, Inc.; Evelyn A. Defillo

(57) ABSTRACT

An assembly and an attachment assembly for an electrical circuit. The assembly having an electrically conductive flexible clip (30) which includes: an electrical circuit clamping conductor clamp; an electrical contact stub (42); an attachment (43) adapted to clamp the electrical contact stub (42) against an electrical contact surface.

11 Claims, 9 Drawing Sheets

REFERENCE ELECTRICAL POTENTIAL ASSEMBLY AND ATTACHMENT ASSEMBLY FOR PRINTED CIRCUIT

CROSS REFERENCE TO RELATED APPLICATION

This application is a national stage entry of PCT/EP2020/025267 filed Jun. 8, 2020, under the International Convention and claiming priority over French Patent Application No. FR1906196 filed Jun. 11, 2019.

TECHNICAL FIELD

The invention concerns the field of electrical connection technology used in particular in aeronautics for avionics bays of aircraft.

Avionics bays are electrical cabinets carried in an aircraft which make it possible to house electrical or electronic equipment items, such as computers or other instruments, and also the electrical cabling connecting these equipment items. These avionics bays are generally of a considerable size and contain numerous electronic or electrical equipment items close to one another, and also a large quantity of cables.

An avionics bay generally comprises a multirack device allowing the equipment items to be inserted and removed while ensuring their mechanical support and their electrical connection. These multirack devices ensure a high level of safety in the management of the electrical equipment items, both during normal operation and during maintenance phases.

PRIOR ART

Aircraft avionics bays generally comprise shelves for supporting electrical or electronic equipment items.

Each electrical or electronic equipment item needs to be connected to the reference electrical potential by being connected to conductive ground parts of the avionics bay.

The assembly of the electrical and electronic circuits on an electrically conductive structure generally comprises mechanical retention of the circuit that is realized by a fixing of the screw, washer, spacer and nut type. Moreover, the electrical connection to the reference potential is generally implemented by a wired connection equipped with two connection terminals. Such assemblies are described in patents CN102781151B, US2010/259907 and U.S. Pat. No. 5,381,314A.

This type of assembly is not compatible with an assembly caused to undergo deformations during its use. Any deformation causes internal stresses in the circuit thus retained.

Moreover, this type of assembly calls for numerous components of small size, this being unfavorable for the maintenance operations.

The electrical connection to the reference potential also requires an anticorrosion protection such as a varnish in order to protect the electrical contact surface against attacks induced in particular by the environment of an aircraft.

SUMMARY OF THE INVENTION

The object of the invention is to improve the electrical assemblies of the prior art.

To this end, the invention is aimed at a reference electrical potential setting and fixing assembly for an electrical circuit, this assembly comprising an electrically conductive flexible fastener which comprises:

a conductive clamp for clamping the electrical circuit;
an electrical contact heel;
a fixing adapted to clamp the electrical contact heel against an electrical contact surface.

The assembly further comprises an electrically conductive tongue comprising a fixing tab for fixing to a structure and having an electrical contact surface, the flexible fastener being fixed to the tongue such that the electrical contact heel is arranged against the electrical contact surface.

The assembly according to the invention combines the two functions of mechanical retention and of electrical continuity into a single subassembly secured to the electrical circuit by virtue of the clamp. A plurality of assemblies can be used to fix an electrical circuit to a support such as an avionics bay shelf, depending on the size of the electrical circuit. This mounting makes it possible to allow the electrical circuit a certain relative movement, for example in response to changes of temperature, mechanical movements, or vibrations, without inducing stresses in the electrical circuit.

An intervention on an aircraft electrical system by a demounting-mounting operation of the assembly is simplified and made more reliable.

There is no need for a chemical compound, such as a varnish or some other protection, in an assembly according to the invention.

The avionics bay according to the invention can comprise the following additional features, alone or in combination:
- the fixing is arranged at the center of the electrical contact heel;
- the flexible fastener comprises means for clamping the clamp on the electrical circuit;
- the flexible fastener comprises two jaws fixed to one another;
- the electrical contact heel is a part attached to one of the jaws;
- the electrical contact heel and the two jaws are secured by riveting;
- the flexible fastener comprises a tightness heel arranged around the electrical contact heel;
- the tongue comprises a nut fixed to a face opposite the electrical contact surface, this nut cooperating with a screw constituting the fixing of the flexible fastener;
- the flexible fastener forms an angle between its conductive clamp and the electrical contact heel which is between 90° and 150°;
- the tongue forms an angle between its fixing tab and its electrical contact surface which is between 90° and 150°;
- the angle of the flexible fastener formed between its conductive clamp and the electrical contact heel, and the angle of the tongue formed between its fixing tab and its electrical contact surface, are substantially equal;
- the flexible fastener comprises a flange, and the tongue comprises a flange, these two flanges between in flat-on-flat contact.

PRESENTATION OF THE FIGURES

Other features and advantages of the invention will become apparent from the following nonlimiting description with reference to the appended drawings, in which:

FIG. 1 illustrates an avionics bay;
FIG. 2 shows a shelf of the avionics bay of FIG. 1;
FIG. 3 shows the shelf of FIG. 2, the module connectors and the external connection interface being demounted;

DETAILED DESCRIPTION

Figure 1:
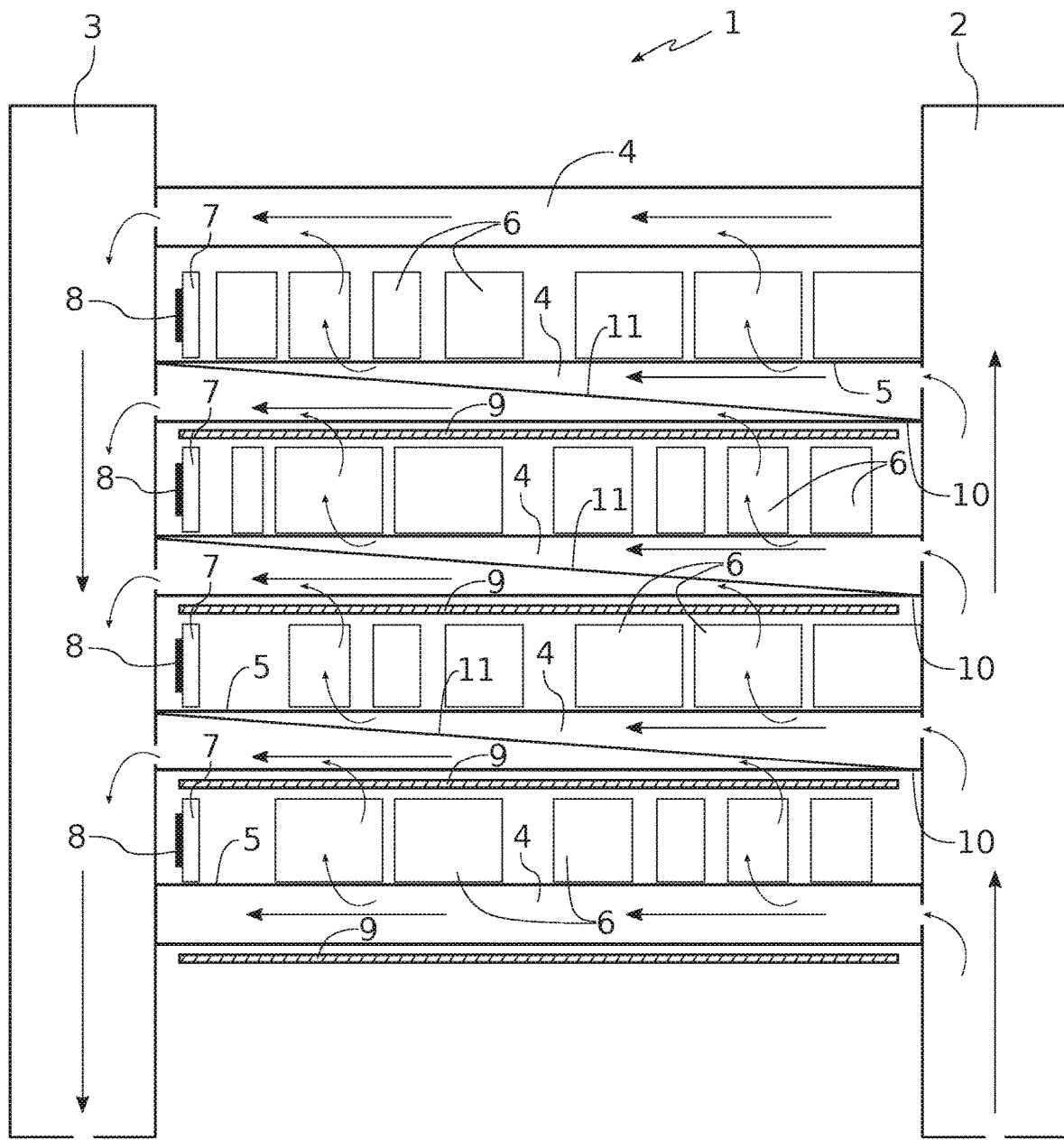

FIG. 1 is a schematic representation of an avionics bay 1 which is a particularly advantageous environment for implementing the reference potential setting and fixing assembly according to the invention.

This avionics bay 1 comprises two lateral uprights 2, 3 between which shelves 4 extend. Each of the shelves 4 is formed by a casing whose hollow part extends between a ventilation wall 10 and a support platform 5 for rackable electrical modules 6 mounted on the shelf 4.

The electrical modules 6 are, for example, electrical or power electronics devices for calculation relating to the navigation, safety, air-conditioning functions, etc. These modules 6 are referred to as rackable, since they are mounted on the shelves 4 in a removable manner by virtue of retaining seats (not shown in this schematic view of FIG. 1) to facilitate the maintenance and the replacement of these modules. These rackable electrical modules 6 are also termed line-replaceable units (LRUs). They are, for example, modules in accordance with aeronautical standard ARINC.

Each shelf 4 comprises, in addition to modules 6, an external connection interface 7 provided with interface connectors 8. The electrical circuit of the aircraft is connected to the avionics bay 1 via these interface connectors 8.

The external connection interface 7 of each shelf 4 is connected to each of the modules 6 mounted on this shelf 4 via an interconnection plate 9 extending parallel to the support platform 5, on the side opposite to the modules 6. In other words, the support platform 5 is situated between the modules 6 and the interconnection plate 9, for each shelf 4.

In the present example, the avionics bay 1 also comprises a device for cooling by circulation of air. This cooling device makes it possible to maintain the electrical and electronic equipment items of the modules 6 at an acceptable temperature given their large number, their density and the heat that they give off.

This cooling device organizes an air circulation shown schematically in FIG. 1 by means of arrows. In the present example, fresh air is injected into the avionics bay 1 via one of its uprights 2 and then is distributed into the shelves 4 forming casings channeling this fresh air to pass through the modules 6. Various portions of each shelf 4 are pierced with ventilation through-orifices (not shown in this schematic view of FIG. 1) allowing the cooling air to pass through the module 6 in order to cool it.

The heated air passing through the modules 6 is then recovered in the shelves 4, which discharge the hot air toward the other upright 3 of the avionics bay 1 in order then to be discharged from the avionics bay 1.

Flow separation walls 11 within the casings formed by the shelves 4 make it possible to separate the fresh air and hot air flows in each shelf 4 if necessary.

Figure 2:
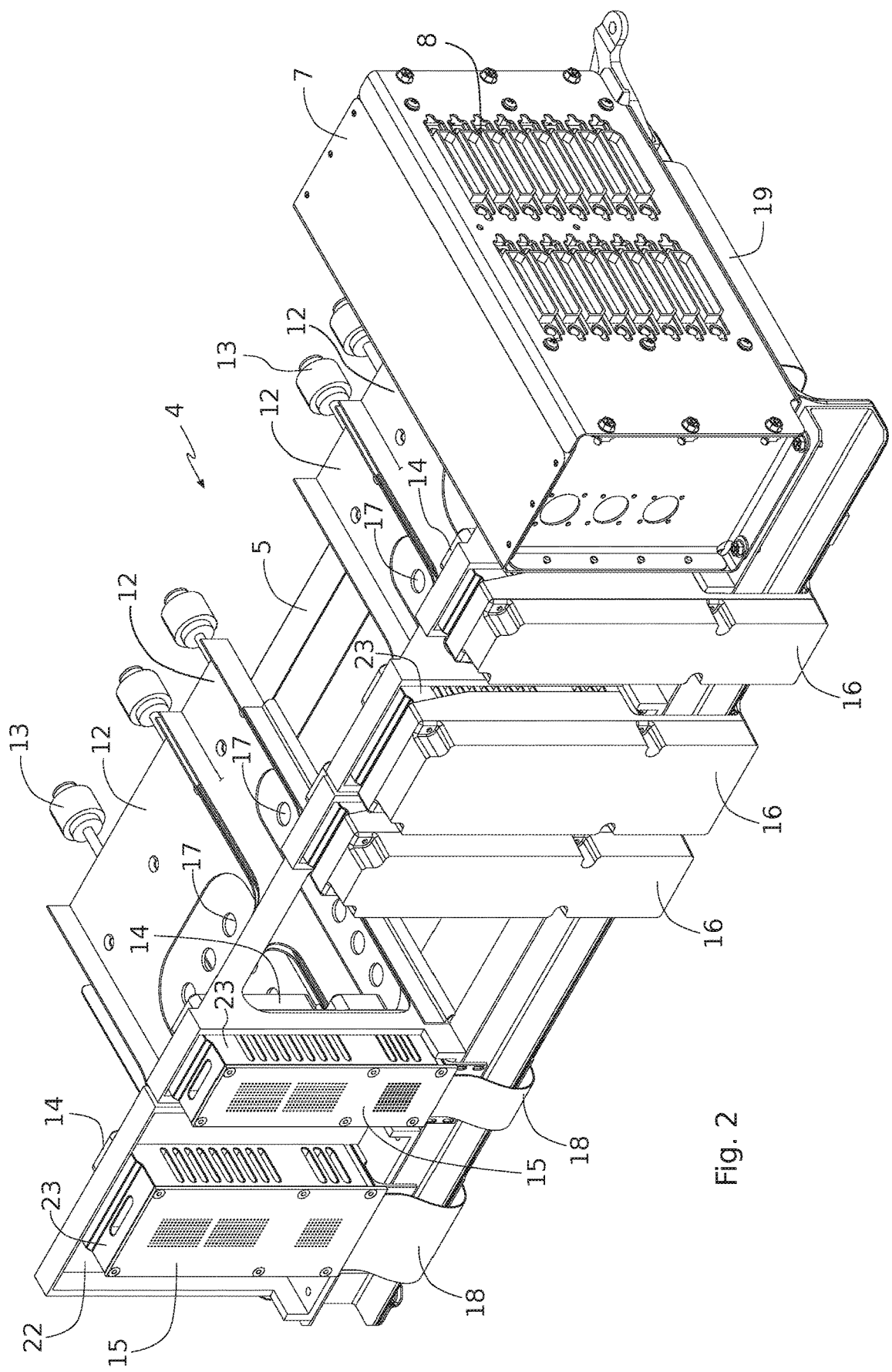

FIG. 2 shows one of the shelves 4 of the avionics bay 1. In this FIG. 2, the module 6 have not been shown. Only the retaining seats 12 intended to receive these modules 6 have been shown in FIG. 2. In the present example, the retaining seats 12 are in accordance with standard ARINC and allow the mechanical fixing and the electrical connection of compatible modules 6. The mechanical locking is provided in particular by thumbwheels 13, while the electrical connection of the modules 6 is provided by module connectors 14.

In the example illustrated in FIG. 2, five retaining seats 12 are mounted on the support platform 5 of the shelf 4, thus making it possible to receive five rackable electrical modules, to fix them by means of the thumbwheels 13 and to electrically connect them to the electrical circuit of the aircraft by virtue of the module connectors 14. The thumbwheels 13 are arranged on the front part of the retaining seats 12, that is to say the part which is accessible to the user when the latter is facing the avionics bay.

As described above, the shelf 4 also comprises an external connection interface 7 provided with interface connectors 8 making it possible to connect all the modules of the shelf 4 to the electrical circuit of the aircraft, in order to electrically supply, and communicate with, all the modules 6 which are intended to be mounted in the retaining seats 12. The external connection interface 7 is also fixed to the support platform 5.

The shelf 4 comprises, furthermore, a plurality of rigid rear printed circuits 15. A rear printed circuit 15 is provided for each module connector 14. Each of the rear printed circuits 15 is thus arranged opposite the module connector 14 of a retaining seat 12. Each rear printed circuit 15 and its corresponding module connector 14 are rigidly fixed to one another.

The rear printed circuits 15 are each protected by a protective shell 16. In FIG. 2, three of the rear printed circuits 15 have been shown with their protective shell 16, while two of the rear printed circuits 15 are shown without their protective shell 16 in order to reveal the rear printed circuits 15.

The retaining seats 12 are each pierced with ventilation through-orifices 17 allowing the fresh air flow emanating from the shelf 4 to pass through the module 6 which will be mounted on this retaining seat 12.

Each of the rear printed circuits 15, on the one hand, and the external connection interface 7, on the other hand, are connected to the interconnection plate 9 (not visible in FIG. 2) by a flexible printed circuit 18, 19. Each protective shell 16 advantageously protects a rear printed circuit 15 and also its flexible printed circuit 18.

The protective shells 16 are, furthermore, provided at their bottom with protruding retaining tabs 61 or lugs in order to retain the interconnection plate 9 once they have been installed at the rear on each rear printed circuit 15. The protective shells 16 thus provide an additional function of retaining the interconnection plate 9.

Figure 3:
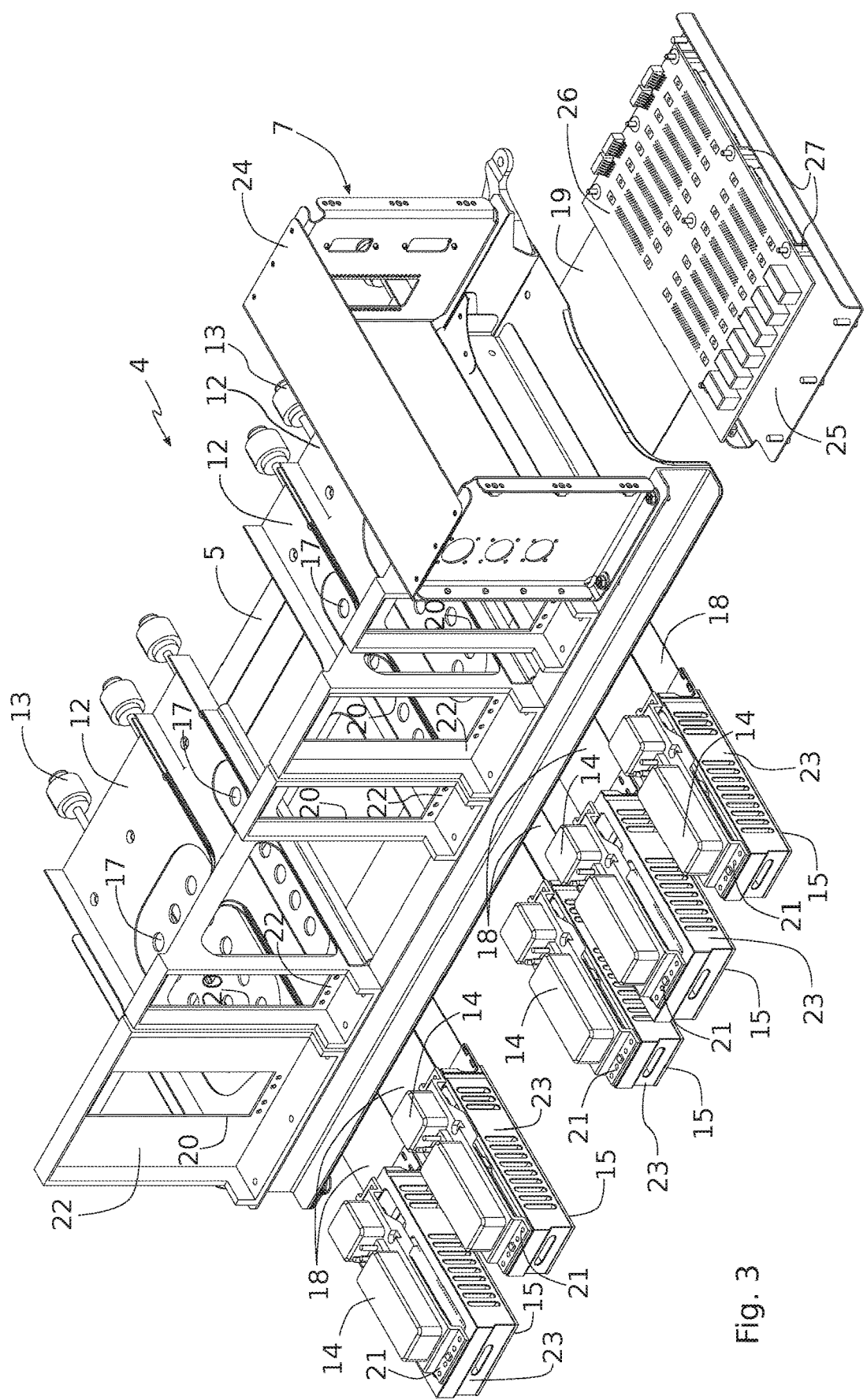

FIG. 3 shows the shelf of FIG. 2 with its module connectors 14 demounted and with its external connection interface 7 open.

Each of the retaining seats 12 comprises an end wall 22 extending perpendicularly to the support platform 5, and in which a connection window 20 is made. Each module connector 14 is mounted on a connection wall 21 which is fixed (when the shelf is in its mounted position of FIG. 1) to the edges of the connection window 20 such that the module connector 14 projects from the connection window 20 in order to be able to connect the module received in the retaining seat 12. The connection walls 21 and the module connectors 14 thus each extend perpendicularly to the support platform 5.

The module connectors 14 can be of any suitable type for providing the connection of a module 6 when this is inserted into the corresponding retaining seat 12 until butting against its end wall 22. The module connector 14 can be in one piece or, by contrast, made up of a plurality of subconnectors. These module connectors 14 are provided with pins extending parallel to the support platform 5, in the direction of the module installed on the retaining seat 12. These pins are interconnection pins which are advantageously demounted and replaceable.

For each retaining seat 12, the connection wall 21 is secured to the rear printed circuit 15 by virtue of a spacer 23. The spacer 23 is here made up of a flange wall extending perpendicularly to the rear printed circuit and arranged on the periphery of the rear printed circuit. The connection wall 21 is fixed on one side of the spacer 23, and the rear printed circuit 15 is fixed on the other side of the spacer 23, the printed circuit thus being parallel to the connection wall 21. The connection wall 21 can advantageously be fixed to the end wall 22 by fixings screwed into the spacer 23.

Figure 6:
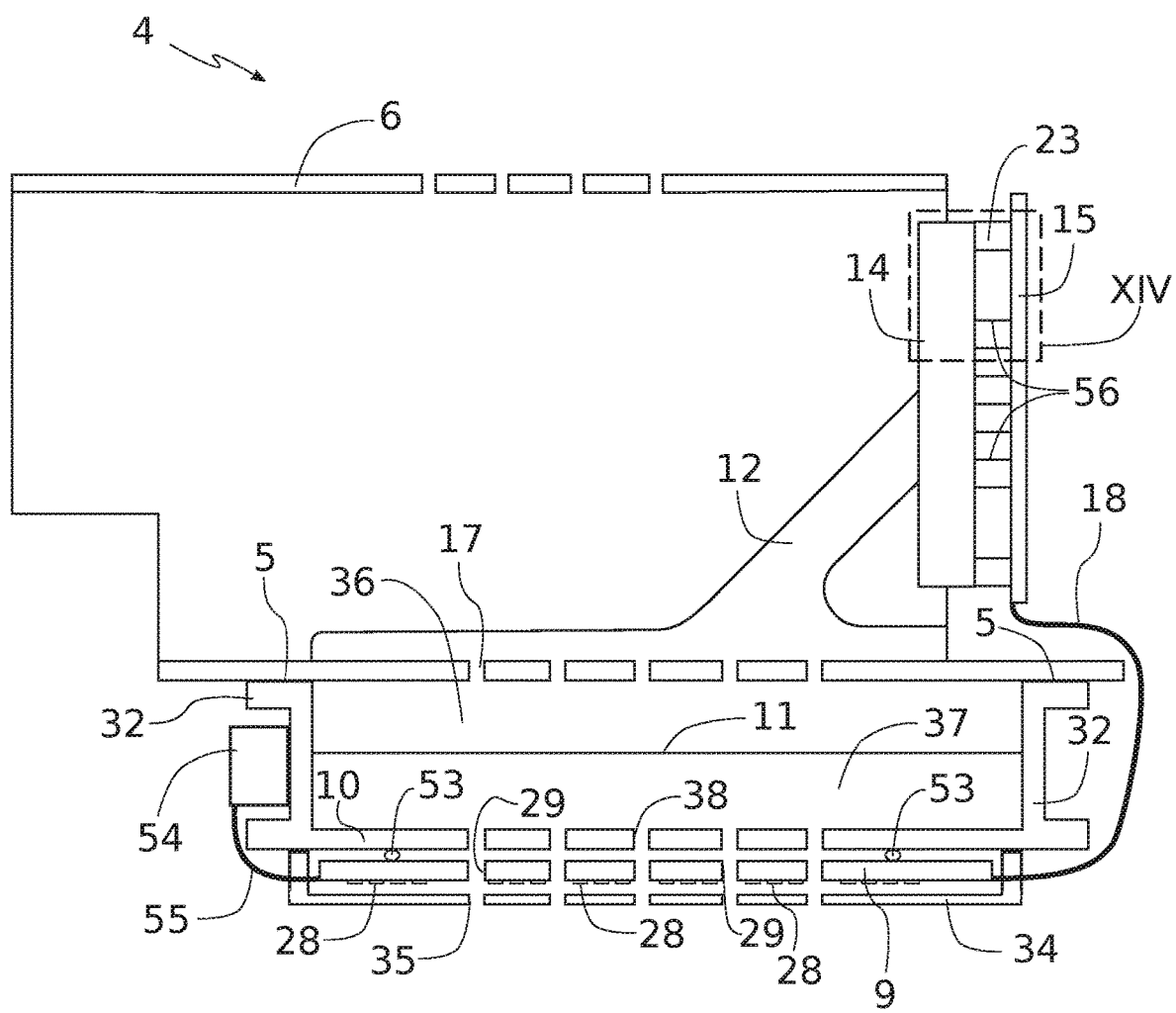
FIG. 6 shows the shelf of FIG. 2 viewed in section.

The pins of the module connector 14 are connected to the corresponding rear printed circuit 15 by any cabling means such as by connection of welded conductors, or more advantageously by force-fitting technologies of the press-fit type. The pins of each module connector 14 are thus demountable and extended by rigid conductive rods which are crimped in the corresponding rear printed circuit 15. These rigid conductive rods are commonly termed "tulips". The module connectors 14 are thus mounted and connected in a quick and reliable manner. The conductive rods 56 are shown in FIG. 6.

The rigid fixing provided by the spacer 23 here allows the use of rigid connections between the module connector 14 and the rear printed circuit 15 and ensures the durability of these connections over time by virtue of a mounting in which the relative movements of the module connector 14 and of the corresponding rear printed circuit 15 are not allowed.

FIG. 3 reveals the possibility of movement of the module connectors 14 when they have been demounted from their connection window 20. This movement is allowed by the flexibility of the flexible printed circuits 18. The fixing, for each module, of the connection wall 21 to the connection window 20 preferably occurs by way of screws accessible from the inside of the retaining seat 12, that is to say from the front face (on the thumbwheels 13 type) of the shelf. An operator can thus easily gain access to a module connector 14 by extracting the module from a retaining seat 12, by unscrewing these screws, and by positioning the connector 14 in its position of FIG. 3 by virtue of the flexibility of the flexible printed circuit 18.

As far as the external connection interface is concerned, the latter is made up of a connection housing 24 comprising an external connection wall 25 (which is shown demounted in FIG. 3). An external connection printed circuit 26 is fixed parallel to the external connection wall 25 by virtue of spacers 27 and is connected to the flexible printed circuit 19.

The interface connectors 8 (visible in FIG. 2) are connected to the external connection printed circuit 26 in a similar manner to the module connector 14. The interface connectors 8 thus comprise pins (not shown in order to simplify the figures) connected by any suitable technique to the tracks of the external connection printed circuit 26, and in particular by force-fitting technology permitted by the external connection printed circuit 26 being rigidly retained with respect to the external connection wall 25. The pins of each interface connector 8 are thus extended by rigid conductive rods which are crimped in the external connection printed circuit 26. The pins of the interface connectors 8 and these rigid conductive rods can be mounted in the same way as the pins and the rods of the module connectors 14.

The external connection interface 7 thus provides, at the interface connectors 8, the connection technology allowing all the pins of the module connectors 14 to be connected to the electrical circuit of the aircraft. The connection housing 24 makes it possible, moreover, to house additional equipment items such as fuses, connectors or displays intended for maintenance, these additional equipment items being able to be directly mounted on the external connection printed circuit 26.

Figure 4:
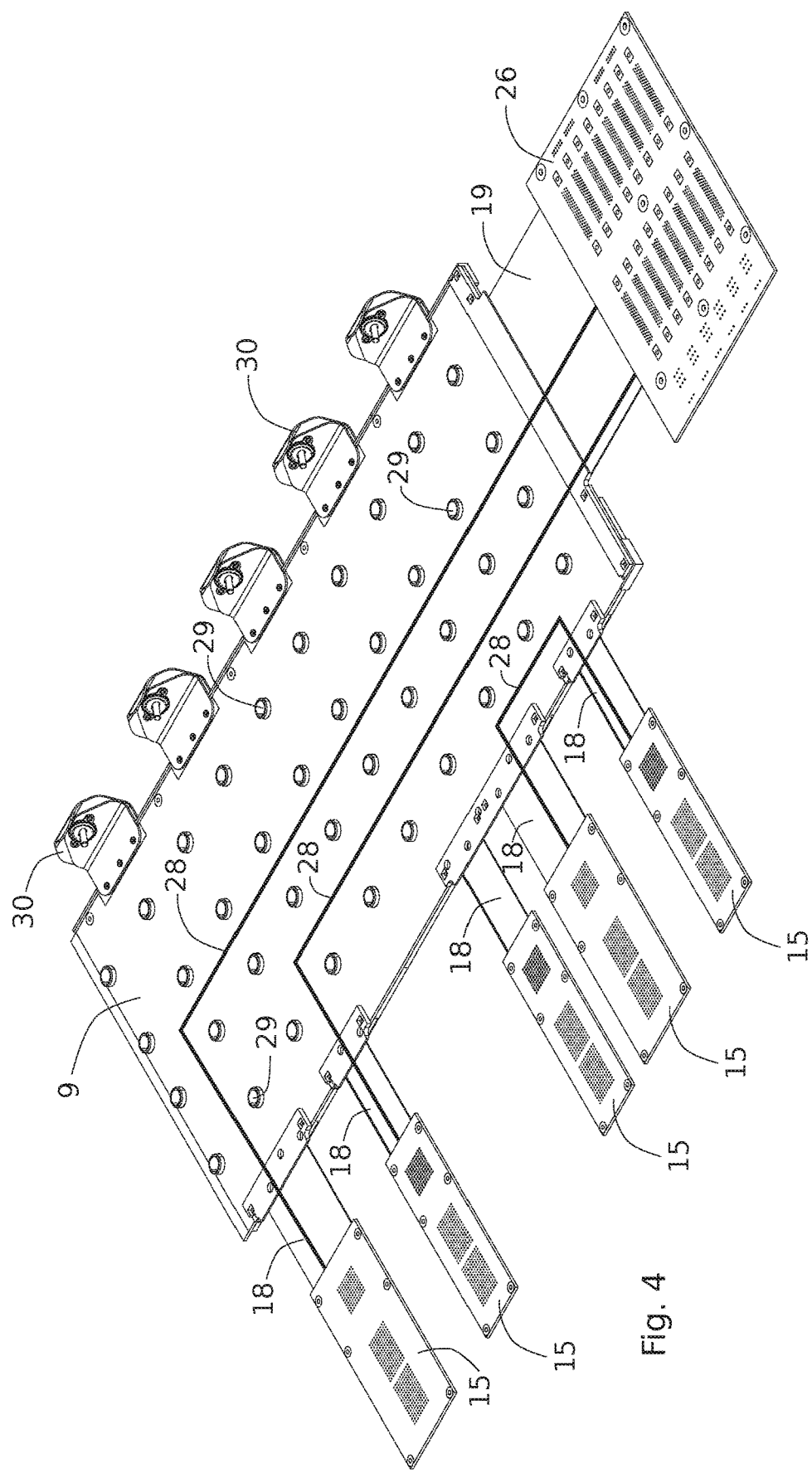
FIG. 4 shows the interconnection assembly of the shelf of FIG. 2.

FIG. 4 illustrates the production of the electrical connection between the module connectors 14 and the interface connectors 8. This FIG. 4 shows an interconnection assembly, the flexible printed circuits 18, 19 and rigid printed circuits 15, 26 of which have been shown, in a flat position illustrating a preferred position for the manufacture of this interconnection assembly.

The rear printed circuits 15 and the external connection printed circuit 26 are each connected to the interconnection plate 9 by virtue of their respective flexible printed circuit 18, 19. In the present example, the interconnection plate 9 is a printed circuit bearing conductive connection tracks 28 connecting the flexible printed circuits 18 to the flexible printed circuits 19 and possibly certain flexible printed circuits 18 to one another. The conductive connection tracks 28 extend, continuously or with possible interconnections, from the rear printed circuits 15 to the external connection printed circuit 26.

In FIG. 4, only some conductive connection tracks 28 have been schematically shown, it being understood that a large number of modules 6 can be mounted on a shelf 4, this generating a large quantity of electrical connections of weak and high power to be provided between the module connectors 14 and the interface connectors 8 or between two connectors 14. Since the area of the interconnection plate 9 is limited only by the area of the shelf 4 itself, this area of the interconnection plate 9 can be adapted to these numerous conductive tracks 28 to be supported. The interconnection plate 9 can, moreover, be formed by a printed circuit with a plurality of layers if the number of conductive tracks 28 so requires.

Each pin of a module connector 14 can thus be connected to a pin of an interface connector 8 by a circuit passing through the rear printed circuit 15, the flexible printed circuit 18, the interconnection plate 9, to the flexible printed circuit 19, and to the external connection printed circuit 26.

The interconnection plate 9 comprises, moreover, a plurality of ventilation through-orifices 29 intended to participate in the function of cooling the avionics bay.

The interconnection plate 9 comprises, furthermore, reference potential setting fasteners 30 making it possible both to mechanically retain the interconnection plate 9 with respect to the corresponding shelf 4 and to electrically ground the interconnection plate 9 with the metallic structure of the shelf 4. The modules 6 and the external connection interface 7 can thus be grounded to the avionics bay 1 in a reliable manner by conductive tracks of the interconnection plate 9.

According to a preferred feature, the interconnection plate 9, the rear printed circuits 15, the external connection printed circuit 26 and also the flexible printed circuits 18, 19 are made in one piece. The interconnection assembly shown in FIG. 4 (with the exception of the fasteners 30) is thus formed by a single printed circuit which comprises rigid portions 15, 9, 26 and flexible portions 18, 19. However, the interconnection plate 9 can also be formed by a flexible printed circuit.

An extremely rapid and reliable manufacture is thus permitted for the complete interconnection system of FIG. 4.

In a variant, if modularity properties are preferred for the interconnection assembly, the flexible printed circuits 18 connected to the rear printed circuits 15 can be connected to the interconnection plate 9 via detachable connectors, thereby making it possible to remove or add rear printed circuits 15, and therefore module connectors 14, from or to the same interconnection plate 9.

Likewise, the flexible printed circuit 19 of the external connection printed circuit 26 can be either produced in one piece with the interconnection plate 9 or, in a variant, connected by detachable connectors making it possible to change the external connection printed circuit 26 in order to replace it if it is defective, or to have the choice of connecting various external connection interfaces 7 to the same interconnection plate 9.

The flexible printed circuits 18, 19 here make it possible to connect elements perpendicular to one another. A weak bending stress is thus imposed on these flexible printed circuits 18, 19 which is a gauge of reliability.

Figure 5:
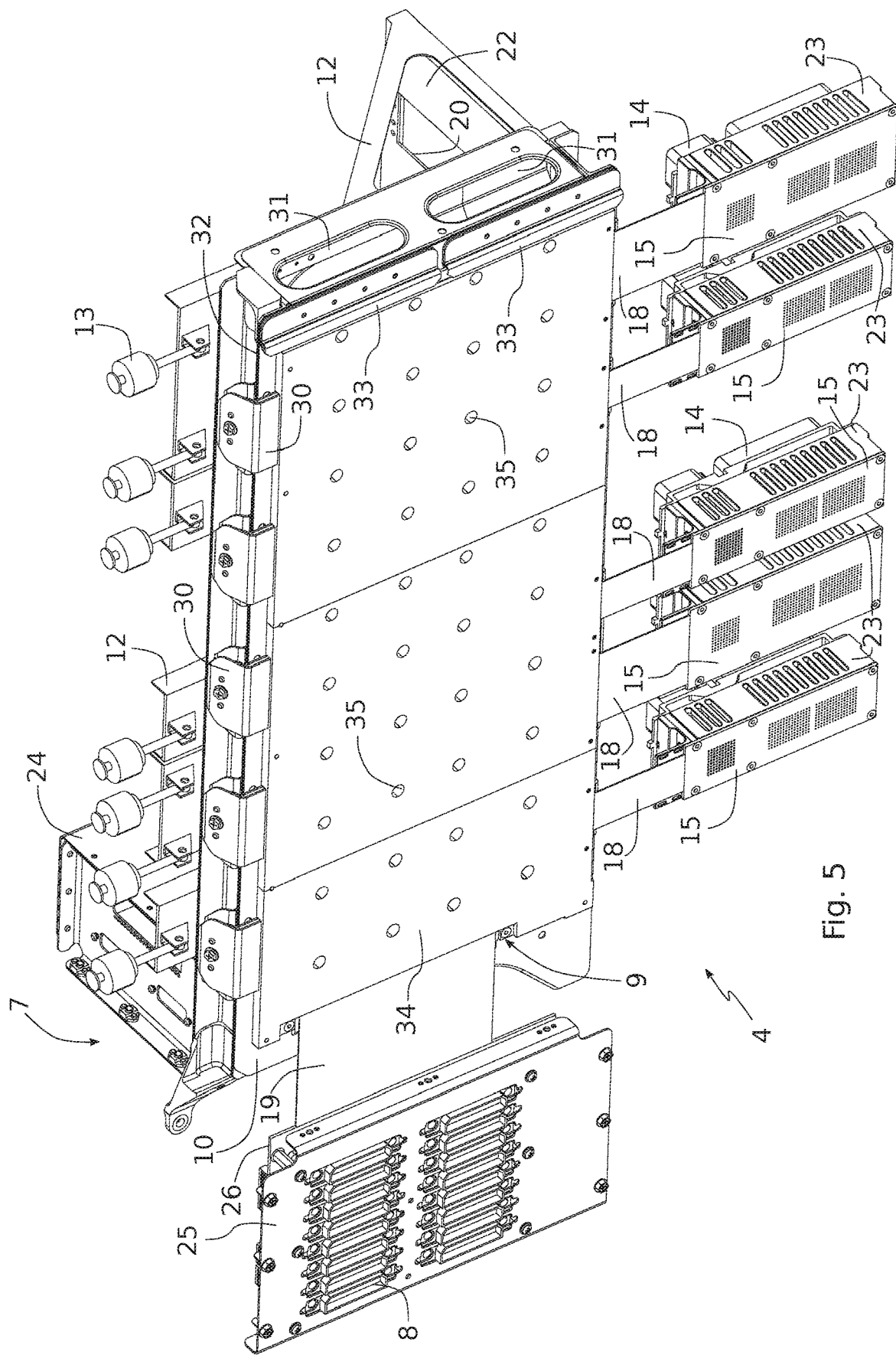
FIG. 5 shows the shelf of FIG. 3 viewed from below.

FIG. 5 shows the shelf 4 of FIG. 3, viewed from below. FIG. 5 illustrates a first embodiment of the assembly of the interconnection plate 9 with the shelf 4.

In this example, the shelf 4 forms a casing inside of which there circulates the cooling air which enters and leaves the casing via aeration openings 31. The support platform 5 delimits the upper part of this casing, whereas the ventilation wall 10 delimits the lower part of this casing, lateral profiles 32 moreover delimiting the lateral edges of the casing.

The interconnection plate 9 is fixed opposite the ventilation wall 10 by virtue of the reference potential setting fastenings 30 which are fixed to one of the lateral profiles 32 and also by additional fasteners 33 whose function is only to clamp the interconnection plate 9 and to fix it to the ventilation wall 10. Moreover, as described above, the protective shells 16 comprise tabs 61 for retaining the interconnection plate 9 and thus also participate in optimally retaining the interconnection plate 9.

In FIG. 5, the interconnection plate 9 is provided with a protective cover 34 covering virtually the whole of its surface area to physically protect it and electrically isolate it. The protective cover 34 is, furthermore, itself provided with ventilation through-orifices 35 arranged opposite the ventilation orifices 29 of the interconnection plate 9.

FIG. 6 is a schematic view in cross section showing the arrangement relating to this first embodiment. In this FIG. 6, a module 6, shown in section, is mounted on a retaining seat. The casing delimited by the shelf 4 comprises an inlet duct 36 and an outlet duct 37 which are separated by the flow separation wall 11.

In the present example, the support platform 5 is made up of two horizontal flanges of the lateral profiles 32 forming two parallel planar crossmembers on which the retaining seats bear. The upper part of the inlet duct 36 is closed by the retaining seats and the calibration of the passage cross section for the cooling air distributed to the module 6 is realized by the diameter and the number of the ventilation orifices 17 of the retaining seats.

As stated above in relation to FIG. 1, the inlet duct 36 distributes fresh air to the module 6 via the ventilation orifices 17 of the retaining seat, and the outlet duct 37 makes it possible to draw in the hot air which has passed through the module 6 which is situated on the bottom shelf (not shown). According to this first embodiment, this hot air is drawn into the outlet duct 37 successively through the ventilation orifices 35 of the protective cover 34, then the ventilation orifices 29 of the interconnection plate 9, then ventilation through-orifices 38 of the ventilation wall 10, these orifices preferably being opposite one another as shown in FIG. 6.

In a variant of FIG. 6, the ventilation orifices 29 of the interconnection plate 9 are smaller than the ventilation orifices 35, 38 of the protective cover 34 and of the ventilation wall 10. The ventilation orifices 35, 38 of the protective cover 34 and of the ventilation wall 10 are therefore oversized, whereas the ventilation orifices 29 of the interconnection plate 9 ensure the calibration of the air permeability of the inlet of the outlet duct 37. The calibration of this air permeability is an important element of the cooling system which is determined during the design of the avionics bay, according to the arrangement of the various elements allowing the generation and the channeling of the cooling air. Since the calibration of this permeability is realized by the interconnection plate, the shelves (and in particular the ventilation walls) and the protective covers 34 can be standardized.

The interconnection plate 9 is directly fixed to the shelf 4 (or even to the ventilation wall 10), with or without a tightness seal 53 or spacer maintaining a spacing between this wall 10 and the interconnection plate 9. In the present example, the fixing of the interconnection plate 9 is ensured by the reference potential setting fasteners 30.

Figure 7:
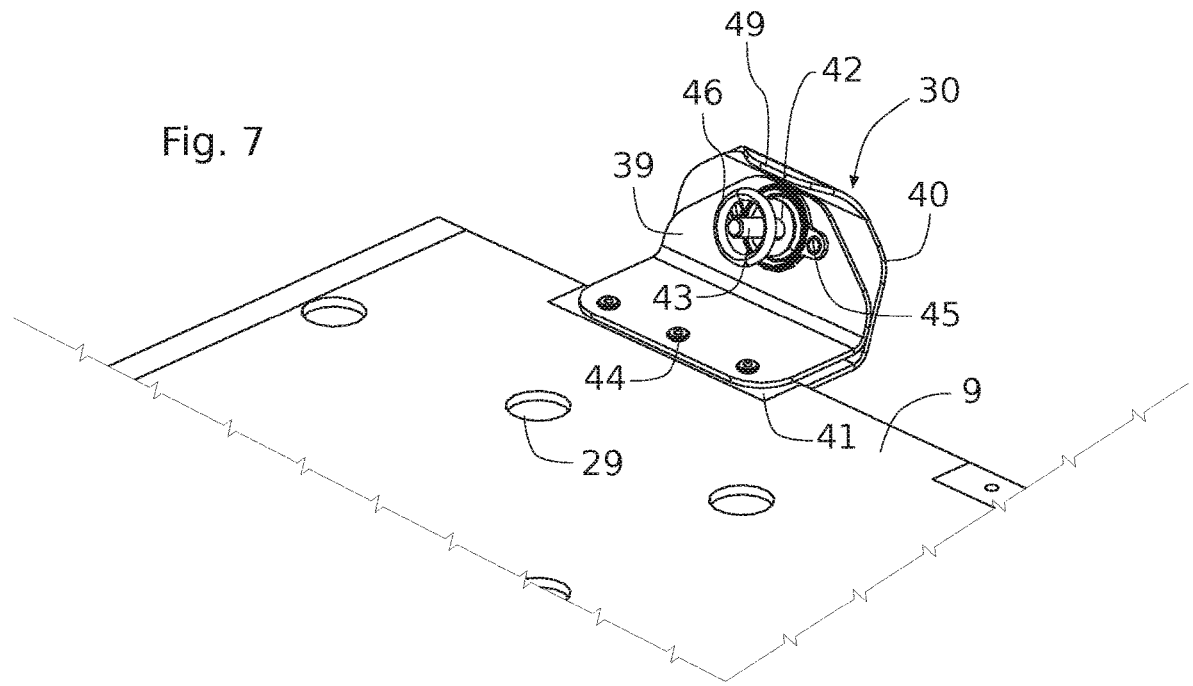
FIG. 7 shows a reference potential setting fastener of the shelf of FIG. 2.
Figure 8:
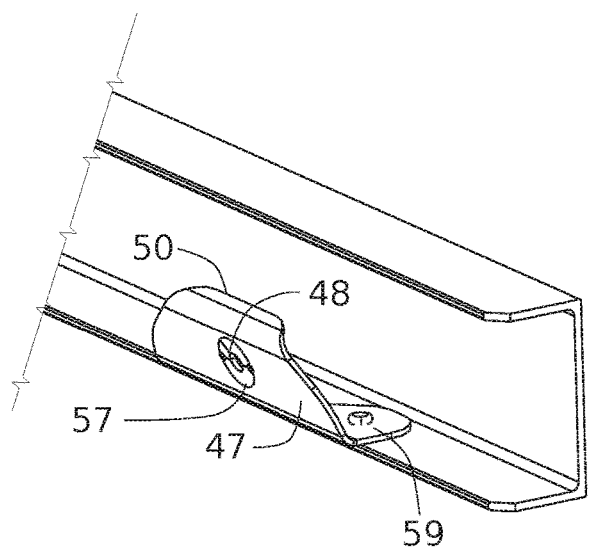
FIG. 8 shows a tongue of the shelf of FIG. 2.
Figure 9:
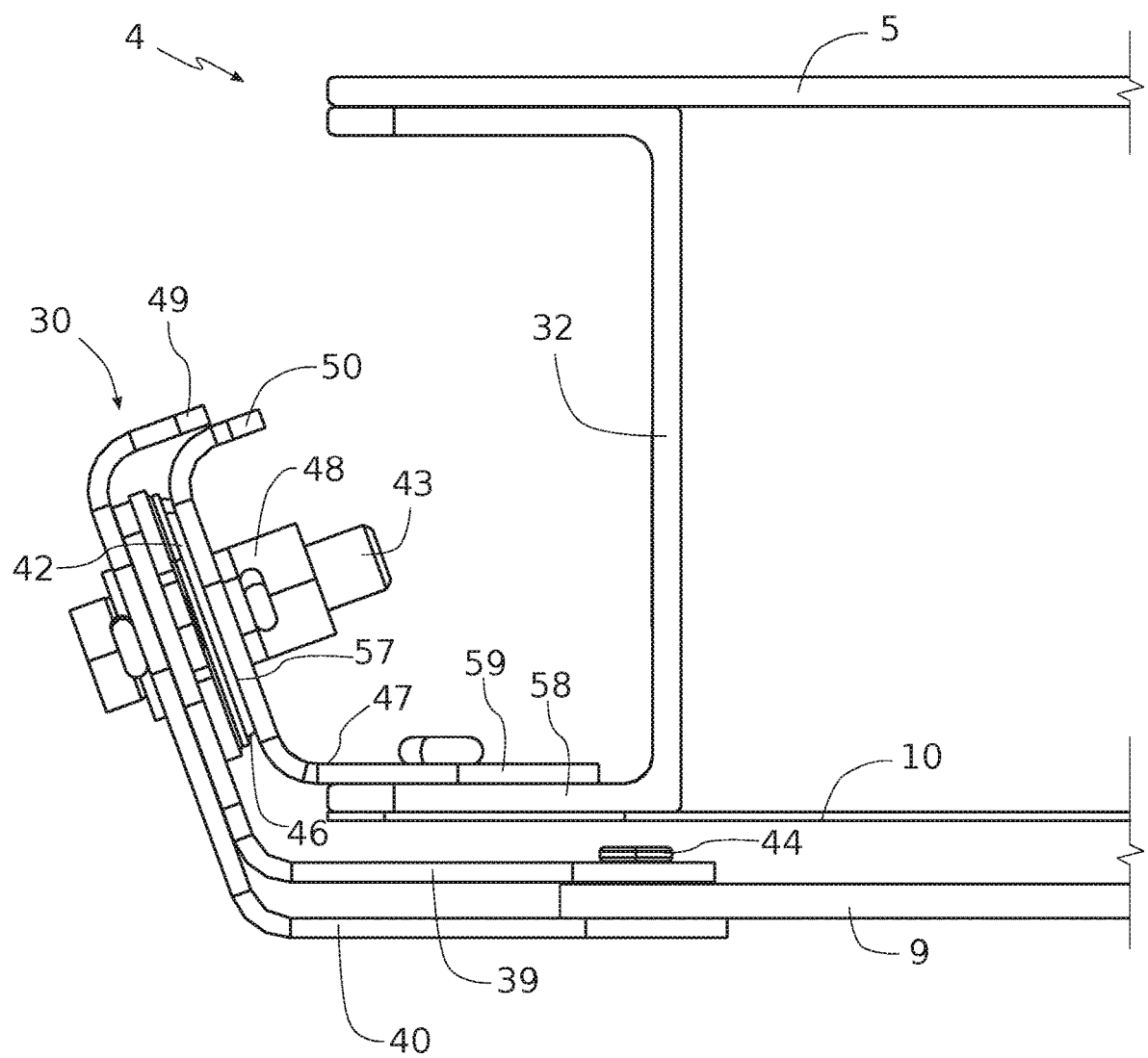
FIG. 9 shows the fastener of FIG. 7 viewed in section.

FIGS. 7 to 9 illustrate a reference potential setting and fixing assembly which comprises one of the fasteners 30 making it possible to connect the interconnection plate 9 to the reference electrical potential and which allows the mechanical retention of this interconnection plate 9.

The fastener 30 is a flexible fastener forming a clamp provided with two jaws 39, 40 clamping the interconnection plate 9 between them. At least one of the two faces of the interconnection plate 9 which is in contact with the fastener 30 comprises a conductive ground pad 41. The conductive tracks of the interconnection plate 9 which have to be connected to the reference electrical potential of the avionics bay should be electrically connected to this conductive pad 41.

The fastener 30 is made of an electrically conductive material such that, when the fastener 30 is clamped on the interconnection plate 9, electrical continuity is established between the conductive pad 41 and a heel 42 which is secured to one of the two jaws 39, 40. The heel 42 comprises in its center an orifice allowing the passage of a fixing screw 43.

Optionally, for better durability and connection security, the fastener 30 is clamped by means of rivets 44 to the interconnection plate 9, and the two jaws 39, 40 are clamped against one another by rivets 45 on either side of the potential setting heel 42.

An O-ring seal 46 may, moreover, be arranged around the potential setting heel 42 in order to seal the reference potential setting.

FIG. 8 shows in perspective a portion of one of the lateral profiles 32 of the shelf 4, this portion being intended to receive the fixing of the fastener 30. To this end, the lateral profile 32 comprises a tongue 47 electrically and mechanically connected to the lateral profile 32. In this example, the tongue 47 comprises a fixing tab 59 fixed by welding or, as illustrated in FIG. 8, by riveting. The tongue 47 comprises a crimped nut 48 so that it can cooperate with the fixing screw 43. The tongue 47 comprises, on its face opposite the crimped nut 48, an electrical contact surface 57.

FIG. 9 shows in section, at the fastener 30, the assembly of an interconnection plate 9 and of a shelf 4. The fixing screw 43 is screwed and clamped on the crimped nut 48 such that the O-ring seal 46 is compressed and the potential setting heel 42 is pressed against the tongue 47.

The fastener 30 thus affords mechanical retention of the interconnection plate 9 without blocking it in place by virtue of the flexibility of the fastener 30 and of the tongue 47. This makes it possible to avoid mechanical stresses within the printed circuit constituting the interconnection plate 9, and to achieve this while firmly retaining this interconnection plate 9. The mounting of the interconnection plate 9 and its reference potential setting are achieved by the mere operation of clamping the fixing screw 43. In order to promote the placement of the fastener 30 with respect to the tongue 47, the fastener 30 comprises a flange 49, and the tongue 47 comprises a flange 50, these two flanges 49, 50 being in flat-on-flat contact when the fixing screw 43 is opposite the crimped nut 48.

With reference to FIG. 9, the fastener 30 and the tongue 47 allow the interconnection plate 9 to be mounted with respect to a surface which is parallel to it (the surface 58 of the lateral profile 32). For this purpose, the tongue 47 has an angle between its electrical contact surface 57 and its fixing tab 59 which is greater than 90°. Moreover, the two jaws 39, 40 of the fastener 30 have the same angle between their clamp-forming portion and their portion bearing the heel 42. This angle is preferably between 90° and 150°. The offset created by this angle allows the assembly visible in FIG. 9, this assembly providing an optimal dynamic behavior for the retention of the electrical circuit made up of the interconnection plate 9.

Figure 10:
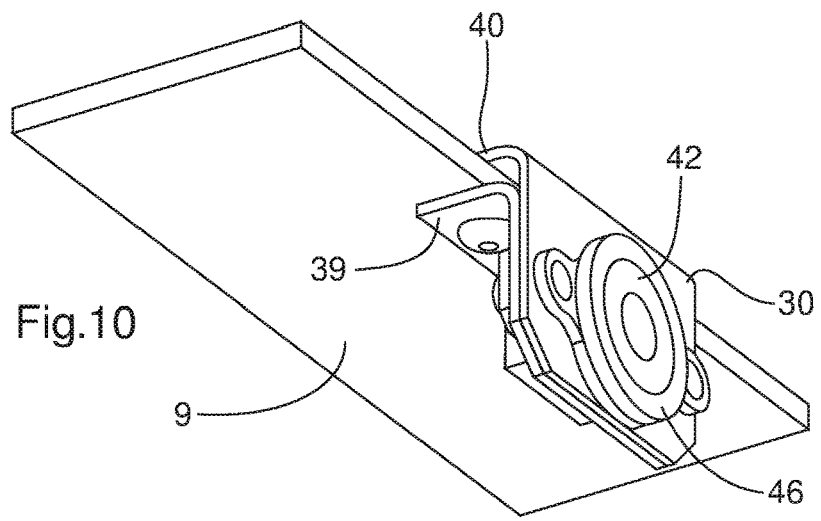
FIG. 10 illustrates a variant of the fastener of FIG. 7.
Figure 11:
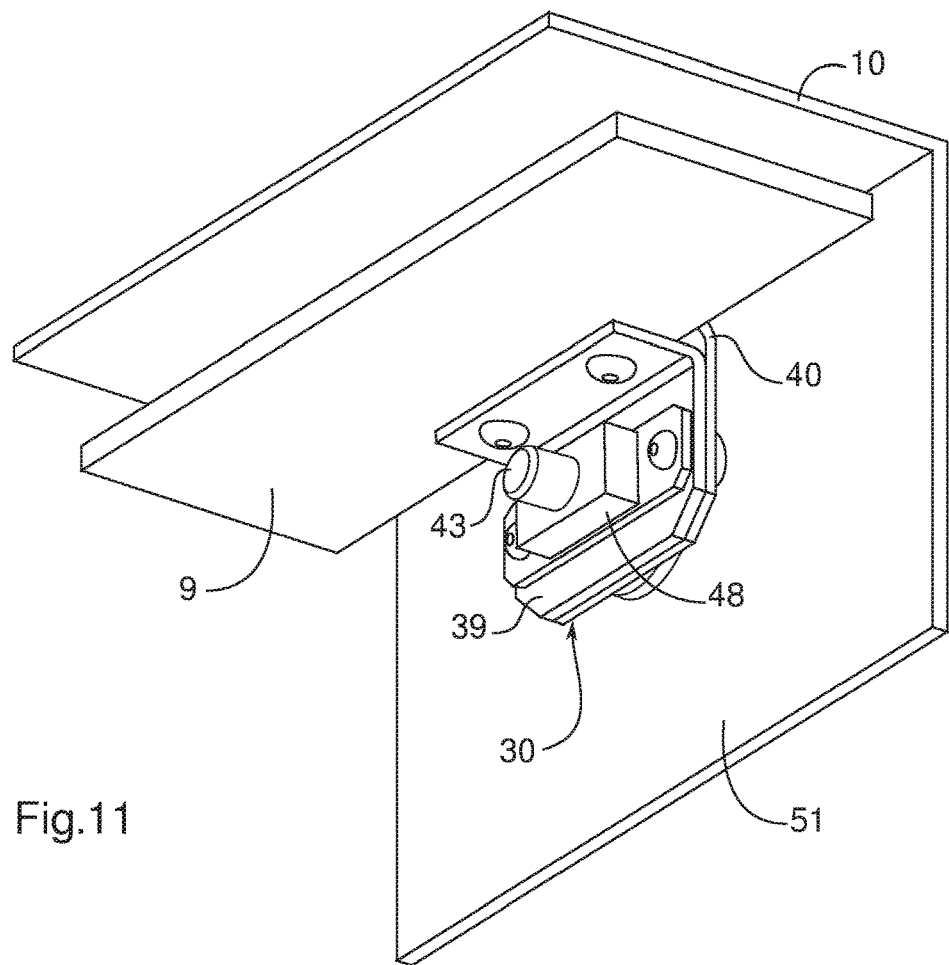
FIG. 11 shows the fastener of FIG. 10 mounted on a shelf.

FIGS. 10 and 11 illustrate a variant embodiment of the reference potential setting fastener 30. In this variant, the ventilation wall 10 comprises a perpendicular flange 51, and the mounting of the interconnection plate 9 opposite the ventilation wall 10 is realized by fixing the fastener 30 to this flange 51. The two jaws 39, 40 of the fastener 30 are here made up of parts in the form of an angle bracket which are adapted to clamp the interconnection plate 9 and to retain it perpendicularly to the flange 51 while ensuring the reference potential setting thereof.

The fasteners 30 do away with the need to resort to braids, cables and ground terminals generally used in addition to the conventional printed circuit fixing means.

The mounting and the connection of such an interconnection assembly to a shelf 4 is achieved by a very restricted number of operations reduced to the fixing of the fasteners 30, 33 to the shelf 4, the fixing of the connection walls 21 to the retaining seats 12, and the mounting of the external connection interface 7. These mounting operations are very limited in number compared with the multiple cabling operations necessary in the avionics bays of the prior art, and this being achieved with much greater connection security while limiting the risks of error.

Variant embodiments of the avionics bay which has been described may be envisioned without departing from the scope of the invention. For example, the choice of a rigid interconnection plate 9 can lead to undersizing the shelf 4. It is possible, for example, to reduce the thicknesses provided for the walls of the shelf 4, and in particular the thickness of the ventilation wall 10, by taking into account the additional rigidity afforded by the fixing of the interconnection plate 9 to the shelf 4.

Likewise, if it is chosen for an interconnection plate 9 to be in the form of a flexible printed circuit, it is possible to provide a flexible or even deformable shelf 4, the flexibility of the interconnection plate 9 accompanying this deformation without inducing any stress which can harm the conductive connection tracks 28.

The protective shells 16 of the rear printed circuits 15 and the protective covers 34 of the interconnection plate may, furthermore, provide electromagnetic compatibility functions, for example by electromagnetically insulating the content thereof.

The integration of components in the front face of the shelf 4 is made possible by the interconnection system. FIG. 6 thus illustrates an example of the integration of an equipment item 54 in the facade of a shelf 4. This equipment item may, for example, comprise displays, relays and command buttons. This facade equipment item 54 does not require any other particular cabling than the addition of an additional flexible printed circuit 55 connected, on the one hand, to this facade equipment item 54 and, on the other hand, to the interconnection plate 9.

Moreover, ribbon cables may replace the flexible printed circuits 18, 19 connecting the rear printed circuits 15 and the external connection printed circuit 26 to the interconnection plate 9.

The invention claimed is:

1. A reference potential setting and fixing assembly for an electrical circuit, the assembly comprising:
an electrically conductive flexible fastener (30) which comprises:
a conductive clamp for clamping the electrical circuit;
an electrical contact heel (42);
a fixing device (43) adapted to clamp the electrical contact heel (42) against an electrical contact surface;
the assembly further comprising an electrically conductive tongue (47) comprising a fixing tab (59) for fixing to a structure and having an electrical contact surface (57), the flexible fastener (30) being fixed to the tongue (47) such that the electrical contact heel (42) is arranged against the electrical contact surface (57); and
wherein the flexible fastener (30) comprise s a flange (49) and the tongue (47) comprises a flange (50), the two flanges (49, 50) being in flat-on-flat contact.

2. The assembly as claimed in claim 1, wherein the fixing device (43) is arranged at a center of the electrical contact heel (42).

3. The assembly as claimed in claim 1, wherein the flexible fastener (30) comprises rivets (44) to clamp on the electrical circuit.

4. The assembly as claimed in claim 1, wherein the flexible fastener (30) comprises two jaws (39, 40) fixed to one another and forming the conductive clamp.

5. The assembly as claimed in claim 4, wherein the electrical contact heel (42) is a part attached to one of the jaws (39, 40).

6. The assembly as claimed in claim 5, wherein the electrical contact heel (42) and the two jaws (39, 40) are secured by riveting.

7. The assembly as claimed in claim 1, wherein the flexible fastener (30) comprises a tightness seal (46) arranged around the electrical contact heel (42).

8. The assembly as claimed in claim 1, wherein the tongue (47) comprises a nut (48) fixed to a face opposite the electrical contact surface (57), the nut (48) cooperating with a screw constituting the fixing device (43) of the flexible fastener (30).

9. The assembly as claimed in claim 1, wherein the flexible fastener (30) forms an angle between the conductive clamp and the electrical contact heel (42), which is between 90° and 150°.

10. The assembly as claimed in claim 9, wherein the tongue (47) forms an angle between the fixing tab (59) and the electrical contact surface (57), which is between 90° and 150°.

11. The assembly as claimed in claim 10, wherein the angle of the flexible fastener (30) formed between the conductive clamp and the electrical contact heel (42), and the angle of the tongue (47) formed between the fixing tab (59) and the electrical contact surface (57), are equal.

\* \* \* \* \*